US005982304A

United States Patent [19]
Selker et al.

[11] Patent Number: 5,982,304
[45] Date of Patent: Nov. 9, 1999

[54] PIEZOELECTRIC SWITCH WITH TACTILE RESPONSE

[75] Inventors: Edwin Joseph Selker, Palo Alto; Jonathan Noble Betts, San Francisco, both of Calif.

[73] Assignee: International Business Machines Corporation, Armonk, N.Y.

[21] Appl. No.: 08/823,472

[22] Filed: Mar. 24, 1997

[51] Int. Cl.[6] .................................................. H03M 11/00
[52] U.S. Cl. ............................ 341/27; 341/22; 200/5 A; 200/512; 310/319; 310/339
[58] Field of Search ................... 341/22, 20, 27, 341/34; 200/513, 516, 517, 5 A, 512; 361/680; 310/339, 340, 319

[56] References Cited

U.S. PATENT DOCUMENTS

| | | | |
|---|---|---|---|
| 4,328,441 | 5/1982 | Kroeger | 310/319 |
| 4,334,280 | 6/1982 | McDonald | 364/710 |
| 4,521,712 | 6/1985 | Braun | 310/339 |
| 4,857,887 | 8/1989 | Iten | 341/34 |
| 5,189,390 | 2/1993 | Fagard | 340/407 |
| 5,212,473 | 5/1993 | Louis | 340/711 |

FOREIGN PATENT DOCUMENTS

| | | |
|---|---|---|
| 278916 | 9/1988 | European Pat. Off. . |
| 3301428 | 10/1991 | Germany . |
| 2115352 | 2/1982 | United Kingdom . |

*Primary Examiner*—Michael Horabik
*Assistant Examiner*—Albert K. Wong
*Attorney, Agent, or Firm*—James C. Pintner; John H. Holcombe

[57] ABSTRACT

A piezoelectric keyswitch for providing tactile response comprises a bimorphic piezoelectric element anchored at its edge, and a keypad mounted on the bimorphic piezoelectric element spaced from the anchored edge so that depression of the keypad flexes the element to generate an electrical signal. A drive circuit responds to the electrical signal to provide a drive signal to bend the piezoelectric element to provide upward tactile feedback to the keypad.

6 Claims, 2 Drawing Sheets

PIEZOELECTRIC SWITCH WITH TACTILE RESPONSE

TECHNICAL FIELD

The present invention relates to piezoelectric keyswitches and, more particularly, to providing tactile feedback for such keyswitches.

BACKGROUND OF THE INVENTION

Conventional mechanical or electromechanical keyswitches provide a tactile response to the user simply as a result of the actuation of the keyswitch. Most modern, and especially portable, keyswitch applications, however, employ shallow keys or keyboards which have limited or no perceivable travel, and no mechanical impact which provides a tactile indication that the key has been actuated.

The typical piezoelectric switch is used in a shallow key arrangement and is actuated by compressing it, also without perceivable travel of the key. Thus, without perceivable travel, there is no tactile response to indicate to the operator that the key has been actuated.

One example of a piezoelectric key in a keyboard is U.S. Pat. No. 5,212,473, Louis, assigned to TypeRight Keyboard Corp., which recognizes the problem of lack of tactile response to a piezoelectric actuator for a key (misnamed "photo-electric" in the drawing) which is directly compressed. The piezoelectric element is mounted on the baseplate of the keyboard so that it will be compressed by pressing on the key. The patent shows conventional pulse generator circuitry which provides a feedback signal to the piezoelectric actuator to cause it to expand slightly. The problem is that such expansion, even at high voltages, is often not perceivable to the operator.

The '473 patent circuitry provides the feedback instantly with the result that the operator is not certain whether any feeling is the result of the operator pressing the key or whether it is the result of feedback.

What is needed is a keyswitch which provides tactile feedback of such strength and timing that it is noticeable by the operator.

SUMMARY OF THE INVENTION

Disclosed is a piezoelectric keyswitch for providing tactile response which comprises a bimorphic piezoelectric element anchored at the outer edge, and a keypad mounted on the bimorphic piezoelectric element spaced from the anchored edge so that depression of the keypad flexes the element to generate an electrical signal. A drive circuit responds to the electrical signal to provide a drive signal to bend the piezoelectric element to provide upward tactile feedback to the keypad. The drive signal is provided a specific delay time after activation of the key so that the operator perceives a substantial tactile feedback just as the finger is compressed to it fullest by compression of the key, and wherein the key has been depressed a finite and noticeable amount.

For a fuller understanding of the present invention, reference should be made to the following detailed description taken in conjunction with the accompanying drawings.

DETAILED DESCRIPTION OF THE INVENTION

Figure 1:
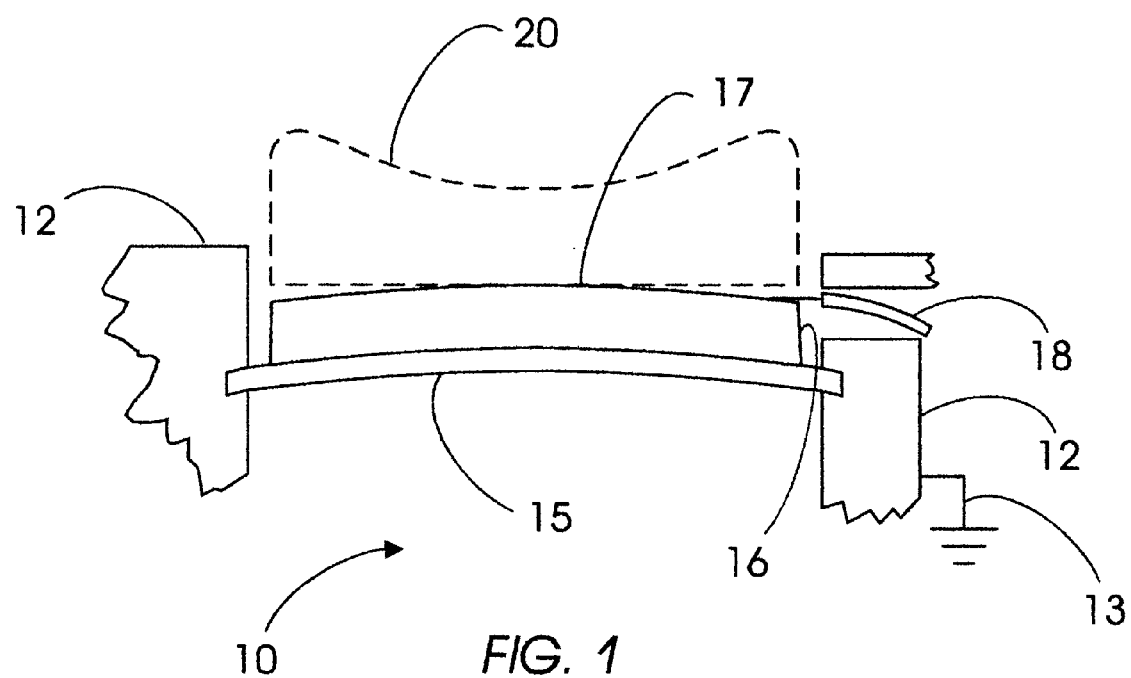
FIG. 1 is a side view of a piezoelectric keyswitch of the present invention.
Figure 2:
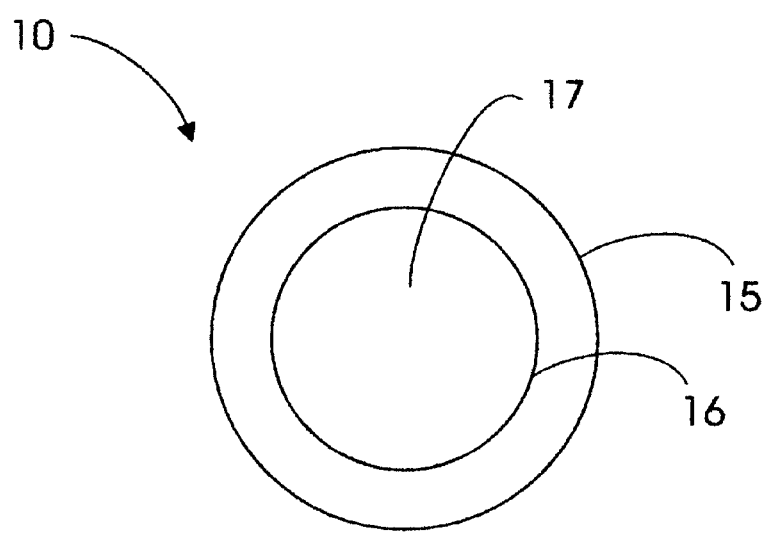
FIG. 2 is a top view of the piezoelectric element of FIG. 1.

Referring to FIGS. 1 and 2, a domed, two layer circular bimorphic piezoelectric element 10 is illustrated. The piezoelectric element is suspended at its edge by a support member 12 that is electrically grounded 13. The piezoelectric element comprises a thin metal disc 15 upon which is cemented a thin disc of piezoelectric ceramic 16. The piezoelectric ceramic 16 and the metal disc 15 are shown artificially expanded in thickness for the purpose of illustration. By means of example, the bimorphic piezoelectric element 10, including the piezoelectric ceramic and metal disc, may be approximately 0.25 mm thick.

An electrode 17 is provided, preferably by plating, on the top surface of the ceramic 16. A small wire 18 is connected to electrode 17. Metal plate 15 may be connected to ground 13 by a wire, or by use of a conductive support member 12.

A keypad 20, shown in phantom, is cemented to the top of the ceramic 16 and on electrode 17.

Depression of the keypad 20 causes the bimorphic piezoelectric element to flex, thereby producing an electrical voltage between the grounded metal disc 15 and the electrode 17. The voltage signal from the electrode 17 is supplied on wire 18.

Figure 3:
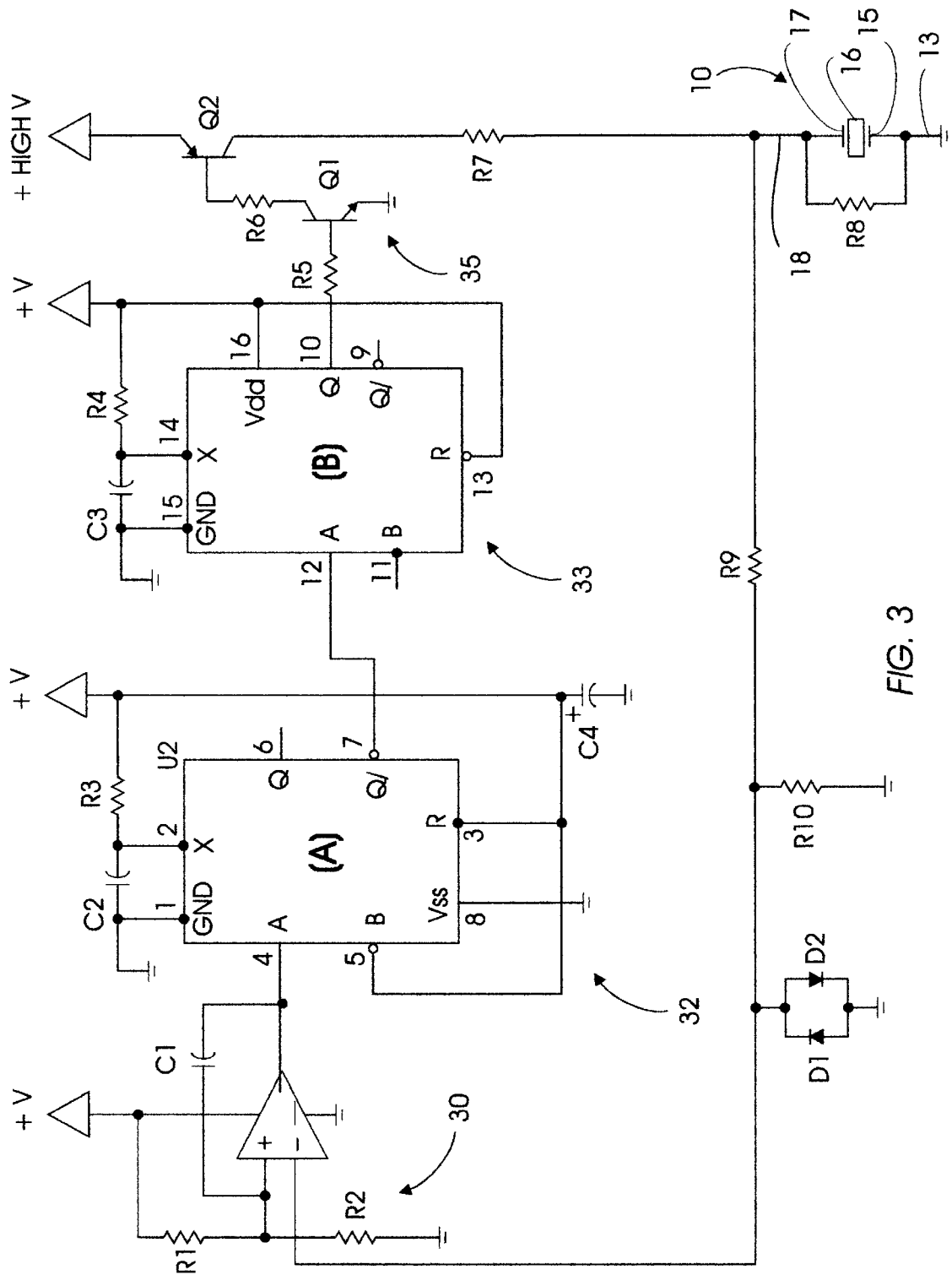
FIG. 3 is a block diagram of a tactile feedback circuit of the present invention.

FIG. 3 is a block diagram of a tactile feedback circuit of the present invention, illustrating the piezoelectric bimorphic element 10, including a schematic representation of piezoelectric ceramic 16, metal disc 15, and electrode 17.

A sensor circuit 30 comprising a sensitive amplifier and comparator detects the actuation voltage from the piezoelectric bimorphic element 10 by comparing the voltage to a threshold. The detected signal is supplied to two monostable multivibrators 32 and 33. The multivibrators provide a predetermined delay and an output signal having a predetermined pulse length. The delayed signal is provided to a high-voltage driver circuit 35. As an example, the high voltage input to circuit 35 is 200 volts.

The delayed high voltage signal is then supplied to electrode 17 which causes the piezoelectric ceramic 16 to expand for the time period of the predetermined pulse from driver 35. The expansion forces the bimorphic piezoelectric element 10 to flex upward to deliver an impulse to the keypad 20. The delay set by the multivibrators 32 and 33 causes the impulse delivered to keypad 20 to be at the approximate time that the operator's finger is compressed at its maximum force against the keypad 20. As an example, the delay time may be 20 milliseconds.

Thus, the operator of the keypad 20 is likely to notice the impulse as clear tactile feedback indicating that the key has been actuated.

While the preferred embodiments of the present invention have been illustrated in detail, it should be apparent that modifications and adaptations to those embodiments may occur to one skilled in the art without departing from the scope of the present invention as set forth in the following claims.

We claim:

1. A keyswitch providing tactile response, comprising:
   a bimorphic piezoelectric element anchored on the outer edge thereof;
   a keypad mounted on said bimorphic piezoelectric element spaced from said anchored edge so that depression of said keypad flexes said element to generate an electrical signal; and a drive circuit responsive to said electrical signal to provide a drive signal to said bimorphic piezoelectric element to flex said element to provide upward tactile feedback to said keypad, said drive circuit providing said drive signal a predetermined delay time after said depression of said keypad, said predetermined delay time such as to cause said drive signal to be delivered to said keypad at substantially the time that an operator's finger is compressed at its maximum force against said keypad.

2. The keyswitch of claim 1, wherein said drive circuit comprises:

two monostable multivibrators to provide said drive signal at said specific delay time.

3. A keyswitch providing tactile response, comprising:

a circular bimorphic piezoelectric element anchored at the edge thereof;

a keypad mounted on said bimorphic piezoelectric element at the center and spaced from said anchored edge so that depression of said keypad flexes said element to generate an electrical signal; and a drive circuit responsive to said electrical signal to provide a drive signal to said bimorphic piezoelectric element to flex said element to provide upward tactile feedback to said keypad, said drive circuit providing said drive signal a predetermined delay time after said depression of said keypad, said predetermined delay time such as to cause said drive signal to be delivered to said keypad at substantially the time that an operator's finger is compressed at its maximum force against said keypad.

4. The keyswitch of claim 3, wherein said drive circuit comprises:

two monostable multivibrators to provide said drive signal at said specific delay time.

5. A tactile feedback circuit for a keyswitch comprising:

a sensor circuit for detecting actuation of said keyswitch;

two monostable multivibrators for providing an output signal after a specific delay time, said output signal having a predetermined pulse length; and a drive circuit for providing a tactile feedback signal to said keyswitch in response to said output signal, said tactile feedback signal having said predetermined pulse length.

6. The tactile feedback circuit of claim 5:

further comprising a piezoelectric element as an element of said keyswitch; and wherein said drive circuit provides a high voltage tactile feedback signal.

* * * * *